(12) United States Patent
Ashida et al.

(10) Patent No.: US 7,088,196 B2
(45) Date of Patent: Aug. 8, 2006

(54) OSCILLATION CIRCUIT AND ELECTRONIC EQUIPMENT COMPRISING SEMICONDUCTOR INTEGRATED DEVICE WITH CLOCK FUNCTION INCLUDING THE OSCILLATION CIRCUIT

(75) Inventors: Hiroyuki Ashida, Kyoto (JP); Yasuhiko Tsuji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 11 days.

(21) Appl. No.: 10/896,851

(22) Filed: Jul. 23, 2004

(65) Prior Publication Data
US 2005/0017812 A1    Jan. 27, 2005

(30) Foreign Application Priority Data
Jul. 25, 2003 (JP) .............................. 2003-279659

(51) Int. Cl.
*H03B 5/32* (2006.01)
(52) U.S. Cl. ............ 331/158; 331/116 R; 331/116 FE; 331/74
(58) Field of Classification Search .................. 331/74, 331/116 FE, 158, 116 R
See application file for complete search history.

(56) References Cited

U.S. PATENT DOCUMENTS 6,278,336 B1 *  8/2001  Tinsley et al. ................. 331/74

FOREIGN PATENT DOCUMENTS

| JP | 06-177646 | 6/1994 |
|----|-----------|--------|
| JP | 11-298248 | 10/1999 |

* cited by examiner

*Primary Examiner*—Arnold Kinkead
(74) *Attorney, Agent, or Firm*—Arent Fox PLLC

(57) ABSTRACT

The present invention provides an oscillation circuit which enables a further decrease of power consumption. The oscillation circuit comprises a piezoelectric oscillator, such as a quartz oscillator, for generating voltage that oscillates at a natural frequency, an inverter for amplifying this oscillation voltage, a Schmitt trigger circuit for shaping the waveform of the output of the inverter and outputting oscillation output signals, and a constant current source which is connected to a power supply line from a battery and supplies current to the power supply of the inverter and the Schmitt trigger circuit.

8 Claims, 4 Drawing Sheets

OSCILLATION CIRCUIT AND ELECTRONIC EQUIPMENT COMPRISING SEMICONDUCTOR INTEGRATED DEVICE WITH CLOCK FUNCTION INCLUDING THE OSCILLATION CIRCUIT

BACKGROUND OF THE INVENTION

1. Field of the Invention

The present invention relates to an oscillation circuit using a piezoelectric oscillator and electronic equipment comprising a semiconductor integrated device with a clock function including the oscillation circuit.

2. Description of the Related Art

There are many conventional electronic equipment, such as digital cameras, that have a clock function to display or record time in real-time. In order to implement the clock function, it is common to comprise an oscillation circuit for a clock and count time by the constant oscillation of the oscillation circuit even if the electronic equipment isn't used. Therefore if the electronic equipment is for portable use, low power consumption is demanded for the oscillation circuit so that the battery to supply power does not run down easily.

The oscillation circuit shown in FIG. 4 is a conventional oscillation circuit where a decrease of power consumption is attempted. This oscillation circuit 101 is comprised of a piezoelectric oscillator 104 for generating voltage that oscillates at a natural frequency, an inverter 111 for amplifying this oscillation voltage, a feedback resistance 105, load capacitors 106 and 107, and a constant voltage source 115 that is connected to a power supply line 110 from a battery 103 for supplying constant voltage to the power supply of the inverter 111. To the internal circuit 113 for counting time, of which power supply is connected to the power supply line 110 of the oscillation circuit 101, output of the inverter 111 of the oscillation circuit 101 is input. In this oscillation circuit 101, the constant voltage that is output by the constant voltage source 115 is set to the minimum voltage at which the inverter 111 can operate, so as to decrease the power consumption of the oscillation circuit 101.

The oscillation circuit shown in FIG. 5 is another conventional oscillation circuit where a decrease of power consumption is attempted. This oscillation circuit 102 comprises a constant current source 114 instead of the constant voltage source 115 of the above-mentioned oscillation circuit 101. In this oscillation circuit 102, a decrease of power consumption is attempted by limiting the current by the constant current source 114 when short-circuit current flows through the inverter 111.

SUMMARY OF THE INVENTION

As described above, a decrease of power consumption is a critical issue, for which many measures have been taken.

FIG. 6 shows a block diagram depicting an electronic equipment, such as a digital camera. This electronic equipment 80 is comprised of an analog signal processing LSI 85, a digital signal processing LSI 86, a liquid crystal display 87, main battery for supplying power to these components, an LSI with a clock function 84 including an oscillation circuit, a backup battery 82 for supplying power to this LSI 84, and a rectifying device (diode) 83 for preventing reverse-current. When the electronic equipment is used, the main battery 81 supplies power to the analog signal processing LSI 85 and other components, and also charges the backup battery 82 via the rectifying device 83. For this backup battery 82, a rechargeable battery, a secondary lithium battery for example, is used. For the oscillation circuit of the LSI with clock function 84, the abovementioned measures for decreasing power consumption has been taken.

However it is difficult to implement a sufficient decrease of power consumption required for electronic equipment, even if such an abovementioned oscillation circuit is used, because of the decrease of battery capacity due to the downsizing of rechargeable batteries caused by the downsizing of electronic equipment, and the decrease of battery capacity due to the repeated recharging.

With the foregoing in view, it is an object of the present invention to provide an oscillation circuit which enables a further decrease of power consumption.

To solve the above problem, the oscillation circuit according to the present invention comprises a piezoelectric oscillator for generating voltage that oscillates at a natural frequency, an inverter for amplifying this oscillation voltage, a Schmitt trigger circuit for shaping the waveform of the output of the inverter and outputting oscillation output signals, and a constant current source which is connected to a power supply line from a battery and supplies current to the power supply of the inverter and the Schmitt trigger circuit.

The oscillation circuit according to the present invention may comprise two separate constant current sources, one for supplying current to the power supply of the inverter and the other for supplying current to the power supply of the Schmitt trigger circuit.

In the oscillation circuit according to the present invention, the Schmitt trigger circuit connected to the constant current source shapes the waveform of the output of the inverter and outputs the oscillation output signals to the internal circuit, so current consumption decreases, and a further decrease of power consumption can be attempted.

DESCRIPTION OF THE PREFERRED EMBODIMENTS

Figure 1:
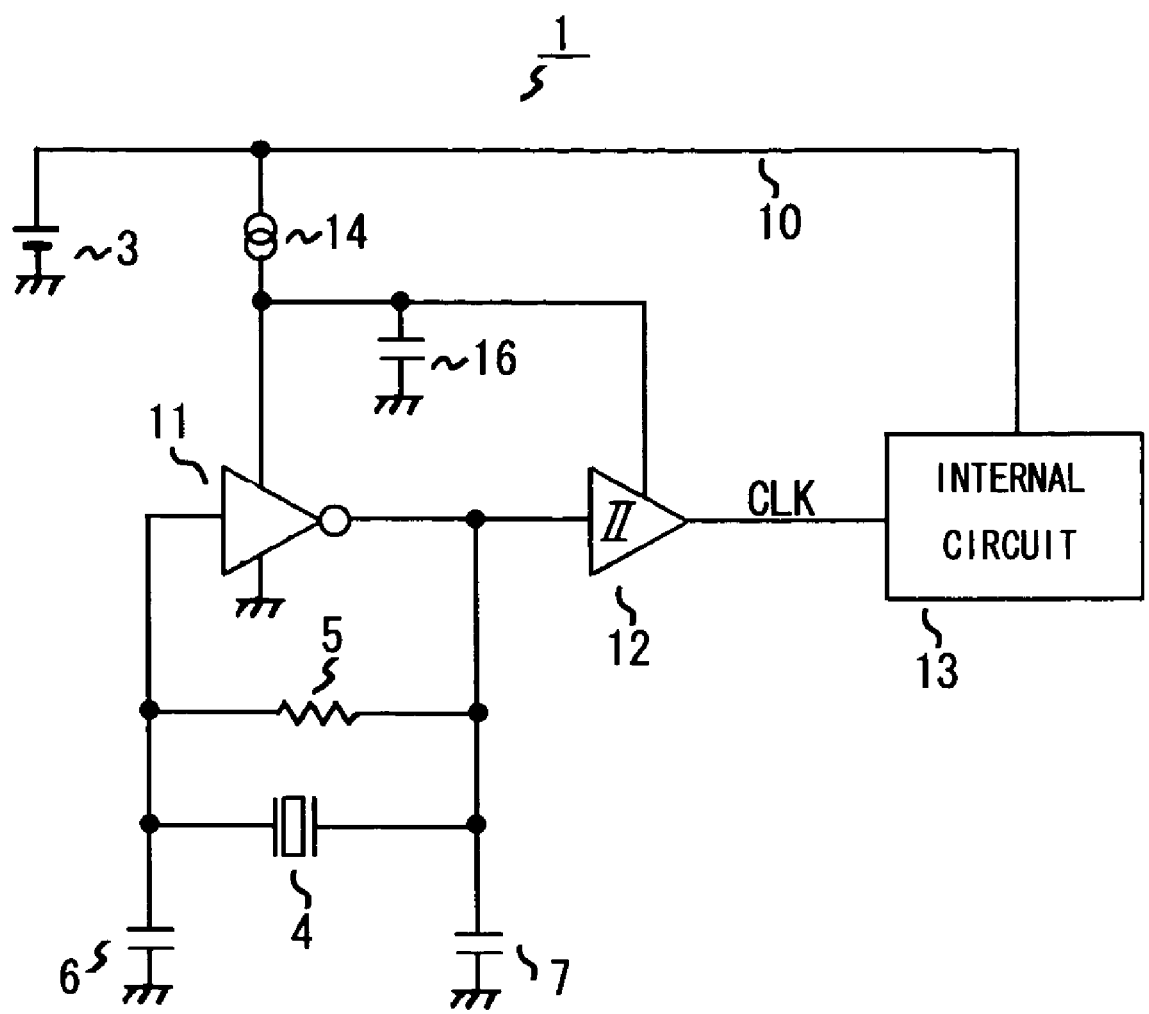
FIG. 1 is a circuit diagram depicting the oscillation circuit according to an embodiment of the present invention.

Embodiments of the present invention will now be described with reference to the accompanying drawings. FIG. 1 is a circuit diagram depicting the configuration of an oscillation circuit 1 according to an embodiment of the present invention.

This oscillation circuit 1 is comprised of a piezoelectric oscillator 4 for generating voltage that oscillates at a natural frequency, 32.768 KHz for example, an inverter 11 for amplifying this oscillation voltage, a Schmitt trigger circuit 12 for shaping the waveform of the output of the inverter 11, and a constant current source 14 which is connected to a power supply line 10 from a battery 3 and supplies current to the power supply of the inverter 11 and the Schmitt trigger circuit 12. Here a quartz oscillator is generally used since an accurate frequency is required for clock use.

The oscillation circuit 1 further comprises a feedback resistance 5 with high resistance value, which is disposed in parallel with the piezoelectric oscillator 4, load capacitors 6 and 7, and a capacitor 16 for stabilizing the power supply of the inverter 11 and the Schmitt trigger circuit 12.

The oscillation voltage generated by the piezoelectric oscillator 4 is amplified by the inverter 11 to a level where the Schmitt trigger circuit 12 can detect high level and low level, and is output to the Schmitt trigger circuit 12, and is also output to the piezoelectric oscillator 4 so that oscillation is continued by positive feedback. At this time, the inverter 11 outputs sinusoidal voltage, so a short-circuit current flows at around the intermediate voltage for a relatively long time. The constant current source 14 limits this short-circuit current. If short-circuit current does not flow at all or does not flow very much to the inverter 11, the current from the constant current source 14 flows into the capacitor 16 and charges are stored. If short-circuit current flows a lot to the inverter 11, the current from the constant current source 14 along with the charges stored in the capacitor 16 compensates the short-circuit current. In this way, the constant current is always consumed regardless the phase of the sinusoidal voltage.

The Schmitt trigger circuit 12 receives the sinusoidal voltage which the inverter 11 outputs, and shapes the waveform into rectangular waves and outputs the rectangular waves as oscillation output signals (CLK). The high and low threshold voltages of the Schmitt trigger circuit 12 are above and below the intermediate voltage of the sinusoidal voltage which the inverter 11 outputs. To this Schmitt trigger circuit 12, the sinusoidal voltage from the inverter 11 is input, so short-circuit current flows, although not as much as in the inverter 11. To limit this short-circuit current, the output of the constant current source 14 is shared with the inverter 11. In the inverter 11, the short-circuit current flows most at around the intermediate voltage, but in the Schmitt trigger circuit 12, the short-circuit current flows most at around the abovementioned high threshold voltage and the low threshold voltage because of hysteresis thereof. Since peak current is dispersed, sharing the constant current source 14 does not affect the inverter 11 very much.

To the internal circuit 13 for counting time, of which power supply is connected to the power supply line 10 of the oscillation circuit 1, the oscillation output signal (CLK) is input from the Schmitt trigger circuit 12 of the oscillation circuit 1. Since the waveform of this oscillation output signal (CLK) has been shaped by the Schmitt trigger circuit 12, the internal circuit 13 decreases the current consumption, compared with the case when sinusoidal waves are directly received.

In this way, the oscillation circuit 1 decreases the power consumption in the inverter 11, Schmitt trigger circuit 12, and the internal circuit 13, so that the battery 3 does not run down easily.

Figure 2:
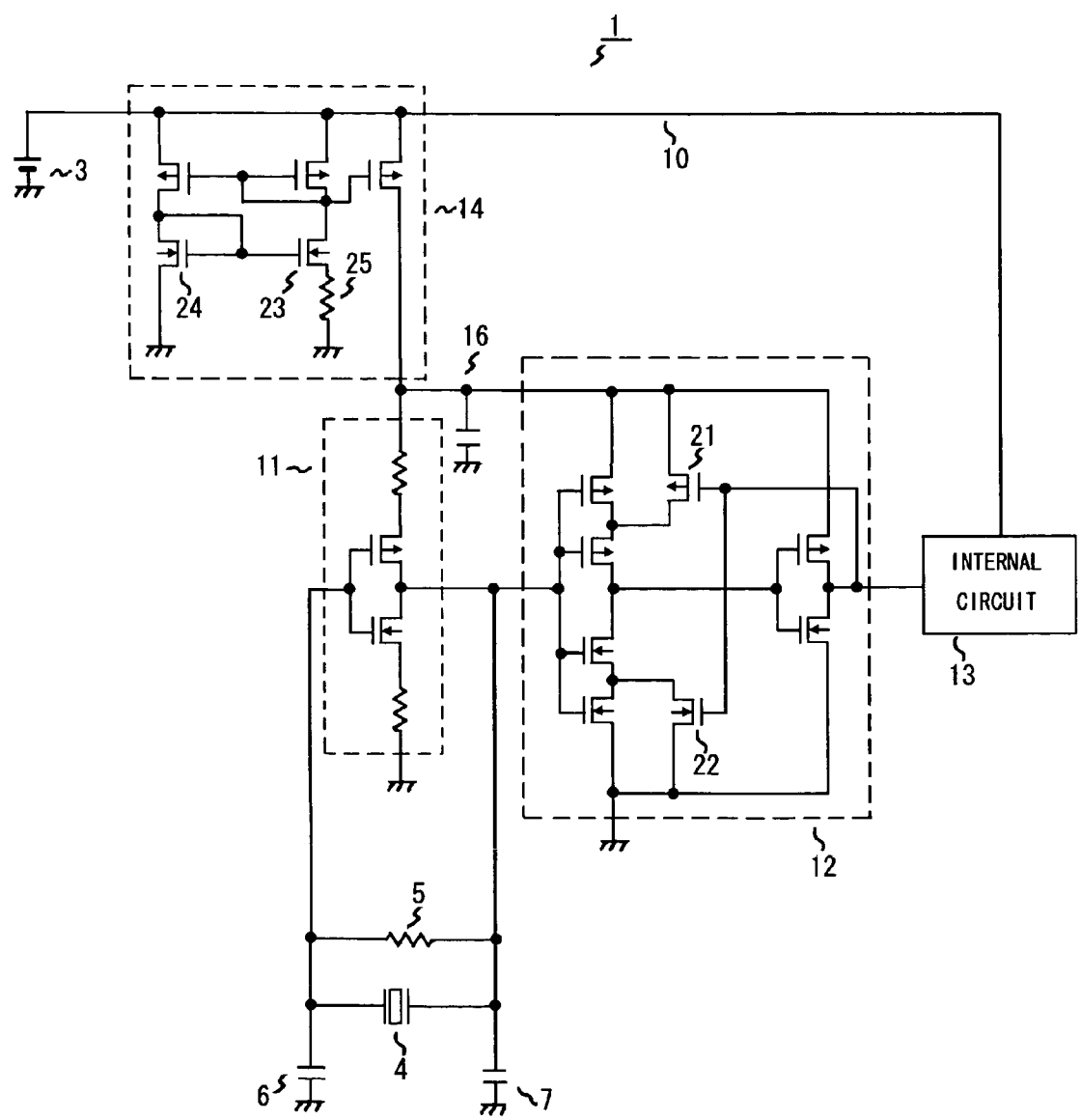
FIG. 2 is a detailed circuit diagram thereof.

Now the oscillation circuit 1 will be described in detail with reference to FIG. 2. The inverter 11 is a CMOS type and has resistance at the power supply side and ground side respectively. These resistances are for decreasing the short-circuit current. The Schmitt trigger circuit 12 has MOS transistors 21 and 22 which turn ON/OFF according to the output level thereof, and the input threshold voltage, namely the high or low threshold voltage, is changed by the MOS transistors 21 and 22. For example, if the output is low level, the MOS transistor 21 turns ON and the MOS transistor 22 turns OFF, so the input threshold voltage, which is determined by one PMOS transistor and two serial NMOS transistors, becomes high voltage. This is high threshold voltage. The constant current source 14 is a band gap type constant current source. The current that the constant current source 14 allows to flow is determined by the size ratio of the NMOS transistors 23 and 24 and the resistance value of the resistance 25.

Figure 3:
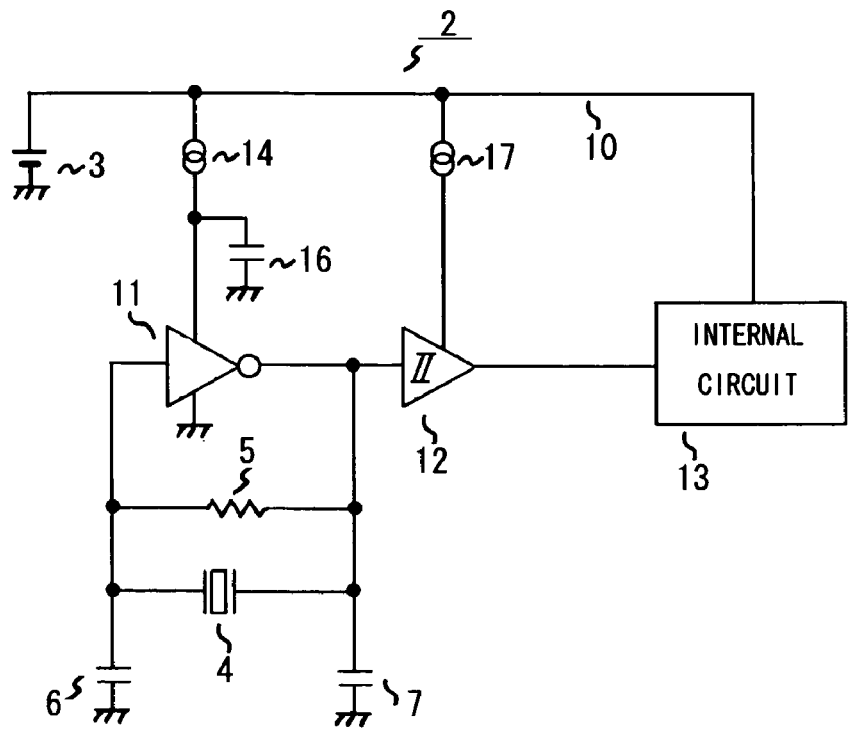
FIG. 3 is a circuit diagram depicting the oscillation circuit according to another embodiment of the present invention.
Figure 4:
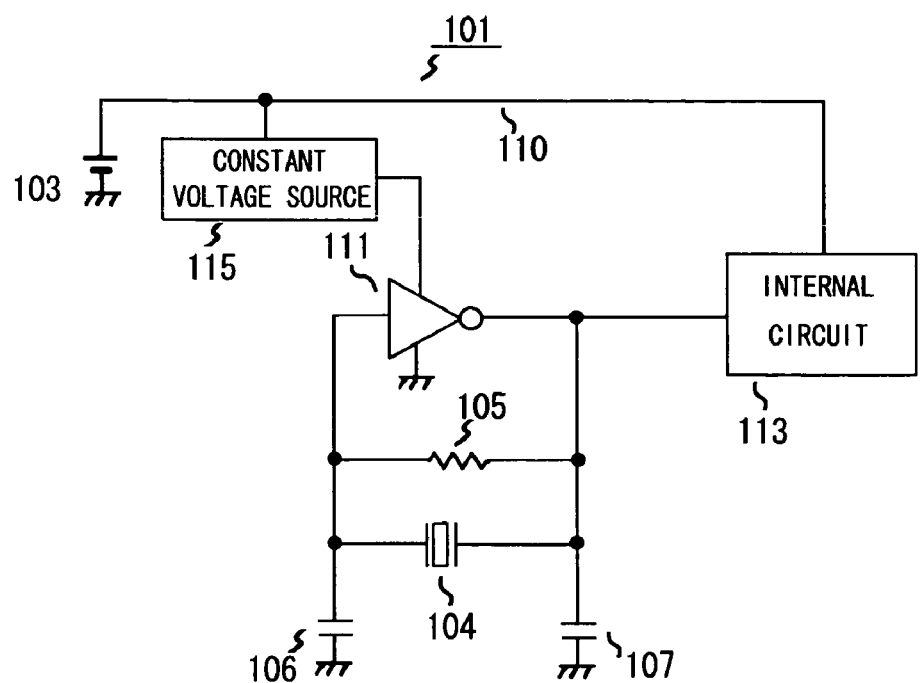
FIG. 4 is a circuit diagram depicting an oscillation circuit of prior art.
Figure 5:
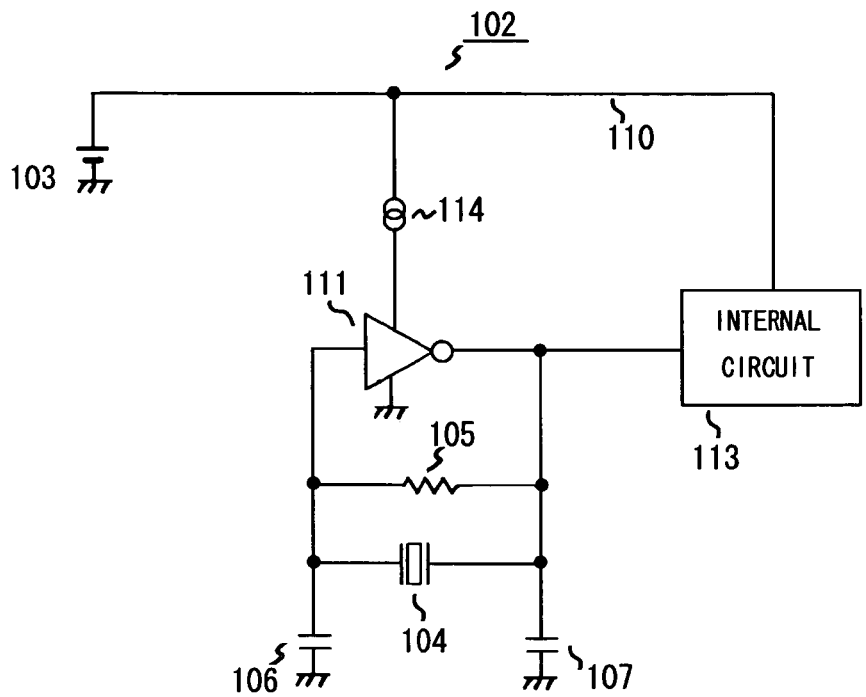
FIG. 5 is a circuit diagram depicting another oscillation circuit of prior art.

FIG. 3 shows an oscillation circuit according to another embodiment of the present invention. This oscillation circuit 2 has two separate constant current sources, one for supplying current to the inverter 11 and the other for supplying current to the Schmitt trigger circuit 12. In other words, the first constant current source 14 supplies current to the inverter 11 and the second constant current source 17 supplies current to the Schmitt trigger circuit 12. The other configuration is substantially the same as the oscillation circuit 1 in the above-described embodiment.

Since this oscillation circuit 2 has separate constant current sources, 14 and 17, the inverter 11 has less influence from the current that flows through the Schmitt trigger circuit 12.

In the above oscillation circuits 1 and 2, the capacitor 16, which is effective in stabilizing the power supply of the inverter 11, can be omitted if this function can be compensated by parasitic capacitance.

Figure 6:
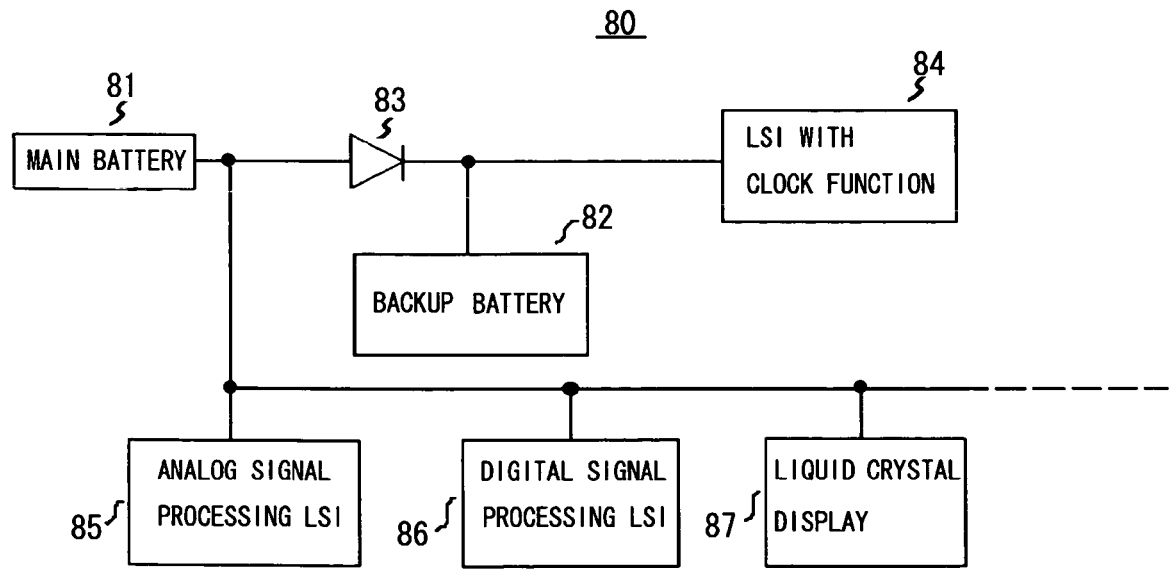
FIG. 6 is a block diagram depicting an electronic equipment comprising a semiconductor integrated device with clock function.

The abovementioned oscillation circuit 1 or 2 is mounted in the semiconductor integrated device (LSI) with clock function shown in FIG. 6, and constitutes the electronic equipment. In this electronic equipment, the rechargeable backup battery 82 is used as the battery 3 of the oscillation circuits 1 and 2. Therefore in the electronic equipment 80, the analog signal processing LSI 85, digital signal processing LSI 86, and liquid crystal display device 87 are connected to the main battery 81, and the semiconductor integrated device (LSI) with clock function 84, where the oscillation circuit 1 or 2 is mounted, is connected to the rechargeable backup battery 82 (battery 3 of oscillation circuits 1 and 2), which is connected to the main battery 81 via a rectifying device 83.

In this electronic equipment 80, reverse-current is prevented by the rectifying device 83 even in a status where the main battery 81 runs down or is removed when the electronic equipment 80 is not used, and the semiconductor integrated device (LSI) with clock function 84 performs the time count operation by receiving power supply from the backup battery 82. Since the oscillation circuit 1 or 2 is mounted, the semiconductor integrated device (LSI) with clock function 84 can improve the period when time can be counted when this electronic equipment is not used.

The present embodiment is not limited to the above mentioned embodiment, but the design can be changed in various ways within the scope of the particulars stated in the Claims. For instance, resistance in the path from the inverter 11 to the piezoelectric oscillator 4 can be inserted to adjust the oscillation amplitude.

What is claimed is:

1. An oscillation circuit, comprising:
    a piezoelectric oscillator for generating voltage that oscillates at a natural frequency;
    an inverter for amplifying said oscillation voltage;
    a Schmitt trigger circuit for shaping the waveform of the output of the inverter and outputting oscillation output signals;
    a constant current source which is connected to a power supply line from a battery and supplies current to the power supply of the inverter and the power supply of the Schmitt trigger circuit; and a capacitor being connected to and stabilizing the power supply of the inverter and the power supply of the Schmitt trigger circuit.

2. An oscillation circuit, comprising:
a piezoelectric oscillator for generating voltage that oscillates at a natural frequency;
an inverter for amplifying said oscillation voltage;
a Schmitt trigger circuit for shaping the waveform of the output of the inverter and outputting oscillation output signals;
a first constant current source which is connected to the power supply line from a battery and supplies current to the power supply of the inverter;
a capacitor being connected to and stabilizing the power supply of the inverter; and
a second constant current source which is connected to the power supply line from the battery and supplies current to the power supply of the Schmitt trigger circuit.

3. An electronic equipment, comprising:
a main battery;
a rechargeable backup battery connected with the main battery via a rectifying device; and
a semiconductor integrated device with a clock function including an oscillation circuit,
wherein said rechargeable battery backup is the battery of said oscillation circuit,
wherein said oscillation circuit comprises:
a piezoelectric oscillator for generating voltage that oscillates at a natural frequency;
an inverter for amplifying said oscillation voltage;
a Schmitt trigger circuit for shaping the waveform of the output of the inverter and outputting oscillation output signals; and
a constant current source which is connected to a power supply line from the battery and supplies current to the power supply of the inverter and the power supply of the Schmitt trigger circuit.

4. An electronic equipment, comprising:
a main battery;
a rechargeable backup battery connected with the main battery via a rectifying device; and
a semiconductor integrated device with a clock function including an oscillation circuit,
wherein said rechargeable battery backup is the battery of said oscillation circuit,
wherein said oscillation circuit comprises:
a piezoelectric oscillator for generating voltage that oscillates at a natural frequency;
an inverter for amplifying said oscillation voltage;
a Schmitt trigger circuit for shaping the waveform of the output of the inverter and outputting oscillation output signals;
a first constant current source which is connected to the power supply line from the battery and supplies current to the power supply of the inverter; and
a second constant current source which is connected to the power supply line from the battery and supplies current to the power supply of the Schmitt trigger circuit.

5. The electronic equipment according to claim 3,
wherein said oscillation circuit further comprises a capacitor being connected to and stabilizing the power supply of the inverter and the power supply of the Schmitt trigger circuit.

6. The electronic equipment according to claim 4,
wherein said oscillation circuit further comprises a capacitor being connected to and stabilizing the power supply of the inverter.

7. The oscillation circuit according to claim 1,
wherein said inverter is a CMOS type.

8. The oscillation circuit according to claim 2,
wherein said inverter is a CMOS type.

* * * * *